(12) United States Patent
Chen et al.

(10) Patent No.: US 12,315,543 B2
(45) Date of Patent: May 27, 2025

(54) CRYOGENIC MEMORY CELL AND MEMORY DEVICE

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Lei Chen, Shanghai (CN); Junwen Zeng, Shanghai (CN); Zhen Wang, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 217 days.

(21) Appl. No.: 17/770,621

(22) PCT Filed: Apr. 10, 2020

(86) PCT No.: PCT/CN2020/084171
§ 371 (c)(1),
(2) Date: Sep. 29, 2022

(87) PCT Pub. No.: WO2021/077691
PCT Pub. Date: Apr. 29, 2021

(65) Prior Publication Data
US 2023/0037252 A1 Feb. 2, 2023

(30) Foreign Application Priority Data
Oct. 21, 2019 (CN) .......................... 201911001686.5

(51) Int. Cl.
G11C 11/00 (2006.01)
G11C 11/16 (2006.01)
H03K 19/195 (2006.01)

(52) U.S. Cl.
CPC ...... G11C 11/1675 (2013.01); G11C 11/1673 (2013.01); H03K 19/1952 (2013.01)

(58) Field of Classification Search
CPC ... G11C 11/161; G11C 11/44; G11C 11/1673; G11C 11/1675; G11C 11/1653;
(Continued)

(56) References Cited

U.S. PATENT DOCUMENTS

| 9,520,180 B1 * | 12/2016 | Mukhanov ............. A61K 8/345 |
| 2014/0296076 A1 | 10/2014 | Okhi et al. |
| 2016/0267964 A1 | 9/2016 | Herr et al. |

FOREIGN PATENT DOCUMENTS

| CN | 109638151 A | 4/2019 |
| CN | 110739010 | 1/2020 |

* cited by examiner

*Primary Examiner* — Thong Q Le
(74) *Attorney, Agent, or Firm* — IPRTOP LLC

(57) ABSTRACT

A cryogenic memory cell and a memory device are provided. The cryogenic memory cell includes a spin moment transfer device. The spin moment transfer device converts a write current into a spin polarization current and changes a magnetic polarization direction under the action of the spin polarization current to achieve write storage of 0 and 1. The cryogenic memory cell also includes a nano-superconducting quantum interference device; a ground terminal of the nano-superconducting quantum interference device is in common-ground connection with a ground terminal of the spin moment transfer device, and the nano-superconducting quantum interference device undergoes a magnetic flux change under the action of a change in the magnetic polarization direction of the spin moment transfer device, thereby (Continued)

switching between a superconducting state and a non-superconducting state under a read current bias, to achieve read-out of 0 and 1.

9 Claims, 2 Drawing Sheets

(58) Field of Classification Search
CPC . G11C 11/18; G11C 2207/007; G11C 7/1006; G11C 7/1075; G11C 17/02; G11C 8/16; H03K 19/1952
See application file for complete search history.

CRYOGENIC MEMORY CELL AND MEMORY DEVICE

FIELD OF TECHNOLOGY

The present disclosure relates to superconducting electronics, in particular, to a cryogenic memory cell and a cryogenic memory device.

BACKGROUND

In recent years, as Moore's Law is coming to an end, the development of computers has entered a bottleneck stage, with the clock frequency of single-core central processing units (CPUs) stagnating at around 4 GHz. Moreover, with the development of supercomputers, the power consumed by large-scale computing has become increasingly huge, and power consumption has gradually become a significant problem in further development of computers. Rapid single flux quantum (RSFQ) digital circuits based on superconducting materials use single-flux voltage pulses with a pulse width in the order of picoseconds to represent "0" and "1", and use Josephson junctions (JJ) as basic elements. RSFQ circuits have overall power consumption of a few milliwatts and an operating frequency up to nearly 100 GHz, and can be applied in high-performance computing with high speed and low power consumption. However, due to the limited integration level of current RSFQ circuits, storage capacity of a memory composed of RSFQ circuits is rather limited and cannot meet the requirement for instruction and data storage under the von Neumann CPU architecture.

In order to be applied in a high-performance superconducting CPU, a memory needs to have the following characteristics: large storage capacity, a high write speed, low power consumption, and compatibility with RSFQ signals. So far, there is no memory with all these characteristics. For example, cryogenic semiconductor memories can have a large storage capacity due to fact that the semiconductor integrated circuit manufacturing technology has already matured. However, subject to physical limitations of semiconductor materials, it's still difficult for cryogenic semiconductor memories to have a high speed and low power consumption, which is especially true in terms of power consumption since elements with a large resistance are usually adopted in cryogenic semiconductor memories in order to achieve a characteristic voltage of about 1V. In addition, a relatively complex RSFQ interface circuit is needed to achieve exchange and conversion between signals of a semiconductor integrated circuit and signals of an RSFQ circuit. Further, a memory device that uses a superconducting ring with a Josephson junction to latch flux quanta to achieve storage of "0" and "1" also has problems such as limited integration of its superconducting circuit, rendering large-capacity storage difficult to realize.

SUMMARY

The present disclosure provides a cryogenic memory cell and a memory device for solving the problems of small storage capacity, a low write speed, high power consumption and incompatibility with RSFQ signals of memory devices in the prior art.

The cryogenic memory cell includes: a spin moment transfer device including an input terminal and a ground terminal, wherein the input terminal of the spin moment transfer device is configured to receive an input write current, the spin moment transfer device converts the write current into a spin polarization current and changes a magnetic polarization direction under the action of the spin polarization current to achieve write storage of 0 and 1; and a nano-superconducting quantum interference device including an input/output terminal and a ground terminal, with the input/output terminal of the nano-superconducting quantum interference device configured to receive an input read current and output a readout signal, the ground terminal of the nano-superconducting quantum interference device is in common-ground connection with the ground terminal of the spin moment transfer device; wherein the nano-superconducting quantum interference device undergoes a magnetic flux change under the action of a change in the magnetic polarization direction of the spin moment transfer device, thereby switching between a superconducting state and a non-superconducting state under a read current bias, to achieve read-out of 0 and 1.

Optionally, the spin moment transfer device includes a fixed magnet-containing layer, a metal layer, and a free magnetic layer stacked successively, the fixed magnet-containing layer is configured to convert the write current into a spin polarization current, and the free magnetic layer changes the magnetic polarization direction when the spin polarization current flows therethrough to achieve write storage of 0 and 1.

Optionally, the spin moment transfer device has a feature size of less than or equal to 100 nm, and the spin moment transfer device has a resistance ranging from 1 ohm to 10 ohm, and the nano-superconducting quantum interference device has a feature size of less than or equal to 100 nm.

The present disclosure also provides a cryogenic memory cell, the cryogenic memory cell including: a spin moment transfer device including an input terminal and a ground terminal, the input terminal of the spin moment transfer device serving as a first input terminal of the cryogenic memory cell to receive an input first write current; a nano-superconducting quantum interference device including an input/output terminal and a ground terminal, the input/output terminal of the nano-superconducting quantum interference device serving as an input/output terminal of the cryogenic memory cell to receive an input first read current and output a readout signal; and an inductor coil including an input terminal and a ground terminal, the input terminal of the inductor coil serving as a second input terminal of the cryogenic memory cell to receive an input second write current and second read current, the ground terminal of the inductor coil is in common-ground connection with the ground terminal of the spin moment transfer device and the ground terminal of the nano-superconducting quantum interference device, and the ground terminal of the inductor coil, the ground terminal of the spin moment transfer device and the ground terminal of the nano-superconducting quantum interference device together serving as a ground terminal of the cryogenic memory cell, wherein in a write operation, under the action of the second write current, the inductor coil generates a pulsed magnetic field, which is coupled to the spin moment transfer device, and the spin moment transfer device undergoes a magnetic moment reversal under the combined action of the first write current and the pulsed magnetic field to achieve write storage of 0 and 1; and in a read operation, under the action of the second read current, the inductor coil generates a magnetic flux coupled to the nano-superconducting quantum interference device, and the nano-wire superconducting quantum interference device switches between a superconducting state and a normal state under the action of the first read current, the magnetic flux coupled to the nano-superconducting quantum interference device generated by the induction coil under the action of the second read current, and a magnetic flux for a magnetic moment of the spin moment transfer device coupled to the nano-superconducting quantum interference device, to achieve read-out of 0 and 1.

Optionally, the spin moment transfer device includes a fixed magnet-containing layer, a metal layer, and a free magnetic layer stacked together, the fixed magnet-containing layer is configured to convert the first write current into a spin polarization current, and the free magnetic layer changes the magnetic polarization direction when the spin polarization current flows therethrough to achieve write storage of 0 and 1.

Optionally, a magnetic flux that is generated by a magnetic moment of the free magnetic layer and coupled to the nano-superconducting quantum interference device is $\varphi_1=\alpha m$, and a magnetic flux that is generated by a magnetic moment of the fixed magnet-containing layer and coupled to the nano-superconducting quantum interference device is $\varphi_2=\alpha m'$, where m is the magnetic moment of the free magnetic layer, m' is the magnetic moment of the fixed magnet-containing layer, and $\alpha$ is a coupling coefficient of the coupling between the magnetic moment of the spin moment transfer device and the nano-superconducting quantum interference device, and a magnetic flux that is generated by the second read current through the inductor coil and coupled to the nano-superconducting quantum interference device is $\varphi_3=LM_R \times I_{read\_X}$, wherein $LM_R$ is a coupling coefficient between the inductor coil and the nano-superconducting quantum interference device, and $I_{read\_X}$ is the second read current; when the first read current is close to a critical current of the nano-superconducting quantum interference device, the readout signal periodically changes, one period of the periodic change of the readout signal is denoted as a flux quantum $\varphi_0$; and when the conditions are satisfied: $\varphi=LM_R \times I_{read\_X}+\alpha m'=\varphi_0/2$, and $\alpha m > \delta\varphi$, the nano-superconducting quantum interference device switches between the superconducting state and the normal state, thereby achieving read-out of 0 and 1, where $\varphi$ is a flux variable of the conversion between the superconducting state and the normal state of the nano-superconducting quantum interference device when the following conditions are met, and $\delta\varphi$ is a width of the conversion between the superconducting state and the normal state of the nano-superconducting quantum interference device when the following conditions are met //原文此句中提到 "如下条 件", 但是下面没有写条件。是否应当为 "如上条件" ?//.

Optionally, the spin moment transfer device has a resistance ranging from 1 ohm to 10 ohm, and the nano-superconducting quantum interference device has a feature size of less than or equal to 100 nm.

The present disclosure also provides a memory device, the memory device including:

a plurality of cryogenic memory cells described in any example above, wherein the plurality of cryogenic memory cells are arranged at intervals in multiple rows and multiple columns;

a data writing RSFQ control circuit, which successively connects first input terminals of the cryogenic memory cells located in a same column in series;

an address compiling RSFQ control circuit, which successively connects second input terminals of the cryogenic memory cells located in a same row in series; and a data readout RSFQ control circuit, which successively connects input/output terminals of the cryogenic memory cells located in a same column in series, wherein ground terminals of the cryogenic memory cells are all grounded.

Optionally, the plurality of the cryogenic memory cells are arranged at intervals in N rows and M columns; the data writing RSFQ control circuit successively connects in series first input terminals of the cryogenic memory cells located in a same one of the columns, respectively, via M connecting lines; the address compiling RSFQ control circuit successively connects in series second input terminals of the cryogenic memory cells located in a same one of the rows, respectively, via N connecting lines; and the data readout RSFQ control circuit successively connects in series input/output terminals of the cryogenic memory cells located in a same one of the columns, respectively, via M connecting lines, where M and N are both integers greater than 1.

As described above, the cryogenic memory cells and cryogenic memory devices of the present disclosure have the following beneficial effects:

In the cryogenic memory cell of the present disclosure, the nano-superconducting quantum interference device is used to read out the magnetic moment change, there is no special requirement on the resistance value of the spin moment transfer device, and thus the resistance of the spin moment transfer device can be greatly reduced, thereby reducing the power consumption for write storage of the cryogenic memory cell and also increasing its write speed; furthermore, the nano-superconducting quantum interference device is used to read out the readout signal, which can be completely compatible with RSFQ circuit signals;

the cryogenic memory cell of the present disclosure has a small size and can achieve high-density integration, thereby achieving high-capacity storage; and the memory device of the present disclosure includes a plurality of cryogenic memory cells with high integration density, and can achieve large-capacity storage.

REFERENCE NUMERALS

Figure 1:
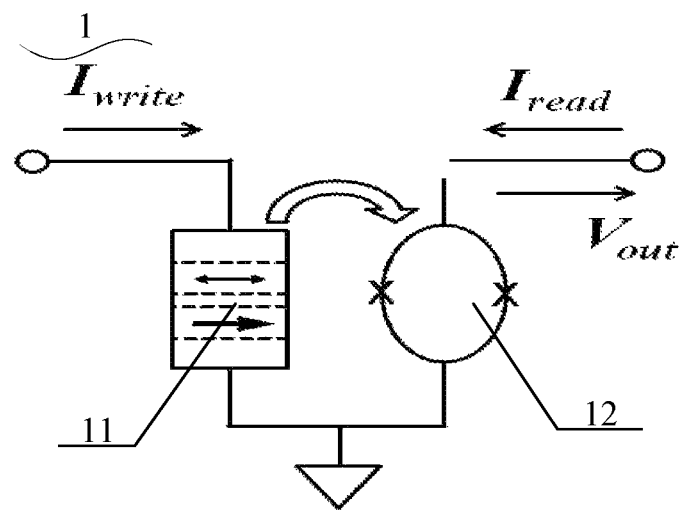
FIG. 1 shows a schematic structural diagram of a cryogenic memory cell provided in Embodiment 1 of the present disclosure.

1 Cryogenic memory cell
11 Spin moment transfer device
111 Fixed magnet-containing layer
112 Metal layer
113 Free magnetic layer
12 Nano-superconducting quantum interference device
13 Inductor coil
2 Data writing RSFQ control circuit
3 Address compiling RSFQ control circuit
4 Data readout RSFQ control circuit
5 Connecting line

DETAILED DESCRIPTION

Embodiments of the present disclosure will be described below with specific examples, and other advantages and effects of the present disclosure will be readily apparent to those skilled in the art from the disclosure in the specification.

Please refer to FIGS. 1 to 4. It is to be noted that the structures, proportions, sizes and the like shown in the accompanying drawings of the specification are only used in conjunction with the disclosure of the specification for understanding and reading by those skilled in the art, and are not intended to define limiting conditions for implementing the present disclosure. All structural modifications, proportional relationship changes or size adjustments should be encompassed within the scope that can be covered by the technical content disclosed in the present disclosure if they do not affect the effects and objectives that can be achieved by the present disclosure. Moreover, the terms "upper", "lower", "left", "right", "intermediate" and "one" as used in this specification are also for convenience of clear description, and are not intended to limit the scope for implementing the present disclosure. Changes or adjustments of relative relationship thereof are also considered to be within the scope for implementing the present disclosure if there is no substantive change in technical contents.

Embodiment 1

Referring to FIG. 1, the present disclosure provides a cryogenic memory cell 1. The cryogenic memory cell 1 includes a spin moment transfer device 11, wherein the spin moment transfer device 11 includes an input terminal and a ground terminal, the input terminal of the spin moment transfer device 11 is configured to receive an input write current $I_{write}$, the spin moment transfer device 11 converts the write current $I_{write}$ into a spin polarization current and changes its magnetic polarization direction under the action of the spin polarization current to achieve write storage of 0 and 1. The cryogenic memory cell 1 also includes a nano-superconducting quantum interference device (nano-SQUID) 12, wherein the nano-superconducting quantum interference device includes an input/output terminal and a ground terminal, the input/output terminal of the nano-superconducting quantum interference device 12 is configured to receive an input read current $I_{read}$ and output a readout signal $V_{out}$, the ground terminal of the nano-superconducting quantum interference device 12 is in common-ground connection with the ground terminal of the spin moment transfer device 11, the nano-superconducting quantum interference device 12 undergoes a magnetic flux change under the action of a change in the magnetic polarization direction of the spin moment transfer device, thereby switching between a superconducting state and a non-superconducting state under a read current bias, to achieve read-out of 0 and 1.

Figure 2:
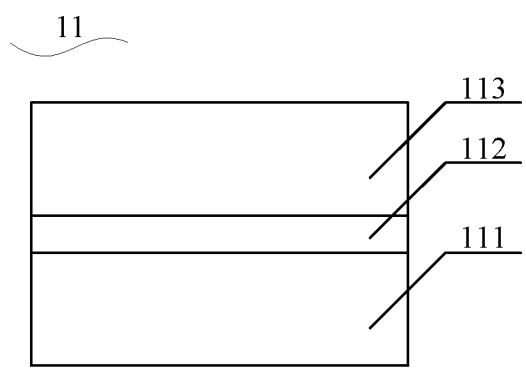
FIG. 2 shows a cross-sectional structural diagram of a spin moment transfer device in a cryogenic memory cell provided in Embodiment 1 of the present disclosure.

As an example, referring to FIG. 2, the spin moment transfer device 11 includes a fixed magnet-containing layer 111, a metal layer 112 and a free magnetic layer 113 stacked together. The fixed magnet-containing layer 111 is a permanent iron magnetic layer, and the fixed magnet-containing layer 111 is configured to convert the write current $I_{write}$ into a spin polarization current, and the free magnetic layer 113 is a temporary iron magnetic layer, and the free magnetic layer 113 changes its magnetic polarization direction when the spin polarization current flows therethrough, thereby achieving write storage of 0 and 1. Specifically, the fixed magnet-containing layer 111, the metal layer 112 and the free magnetic layer 113 may be stacked successively from bottom to top. The specific structures of the fixed magnet-containing layer 111, the metal layer 112 and the free magnetic layer 113 are known to those skilled in the art.

The spin moment transfer device 11 needs a drive current of around 0.1 milliamp (mA) to 0.2 mA. For a semiconductor magnetic memory (e.g. MRAM) in the prior art, to maintain a semiconductor device at a standard voltage of around 1V and effectively read out a resistive-state resistance value, a magnetic tunnel junction device needs to be further connected in series with the spin moment transfer device 11 so that the resistance of the memory cell cam ne around 10K ohm. In the cryogenic memory cell 1 in the present disclosure, as the spin moment transfer device 11 is in common-ground connection with the nano-superconducting quantum interference device 12, and the nano-superconducting quantum interference device 12 reads out the required readout signal, there is no special requirement on the resistance value of the spin moment transfer device 11, and thus the resistance of the spin moment transfer device 11 can be greatly reduced (the resistance of the spin moment transfer device 11 only needs to be 1 ohm to 10 ohm), thereby reducing the power consumption for write storage of the cryogenic memory cell 1 and increasing its write speed; as the spin moment transfer device 11 is in common-ground connection with the nano-superconducting quantum interference device 12, and the nano-superconducting quantum interference device 12 reads out the required readout signal, the readout signal can be completely compatible with RSFQ circuit signals; furthermore, in terms of the cell size, the spin moment transfer device 11 has a feature size of less than or equal to 100 nm (preferably, in one embodiment, the spin moment transfer device 11 has a feature size of 100 nm or less) and the nano-superconducting quantum interference device 12 has a feature size of less than or equal to 100 nm (preferably, in one embodiment, the nano-superconducting quantum interference device 12 has a feature size of 100 nm or less), and the nano-superconducting quantum interference device 12 used here may be 100 nm or less, such that the entire the cryogenic memory cell 1 is around 100 nm, and using a plurality of cryogenic memory cells 1 in combination can achieve high-density integration, thereby achieving high-capacity storage.

Embodiment 2

Figure 3:
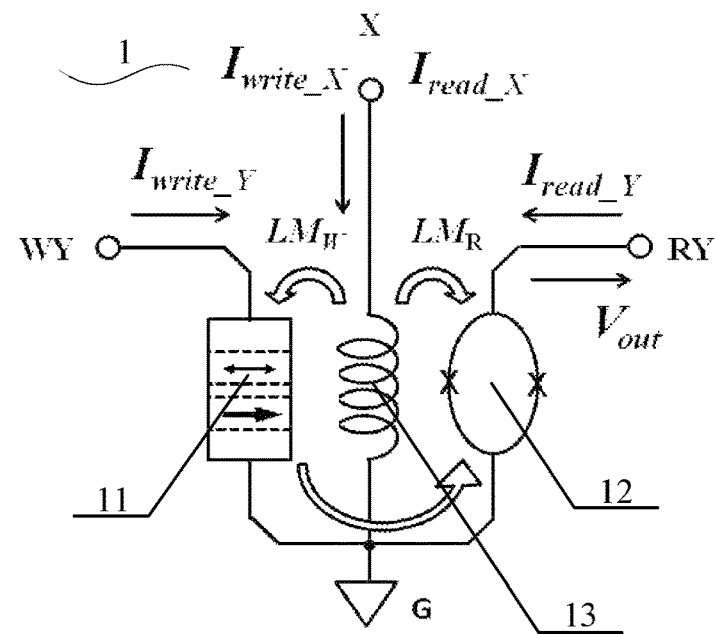
FIG. 3 shows a schematic structural diagram of a cryogenic memory cell provided in Embodiment 2 of the present disclosure.

Referring to FIG. 3, in conjunction with FIGS. 1 to 2, the present disclosure also provides a cryogenic memory cell 1. The cryogenic memory cell 1 includes: a spin moment transfer device 11, wherein the spin moment transfer device 11 includes an input terminal WY and a ground terminal, the input terminal WY of the spin moment transfer device 11 serves as a first input terminal of the cryogenic memory cell 1, the spin moment transfer device 11 is configured to input a first write current $I_{write\_Y}$; a nano-superconducting quantum interference device 12, wherein the nano-superconducting quantum interference device 12 includes an input/output terminal RY and a ground terminal, the input/output terminal RY of the nano-superconducting quantum interference device 12 serves as an input/output terminal of the cryogenic memory cell 1, the input/output terminal RY of the nano-superconducting quantum interference device 12 is configured to input a first read current $I_{read\_Y}$ and output a readout signal $V_{out}$; and an inductor coil 13, wherein the inductor coil 13 includes an input terminal X and a ground terminal, the input terminal X of the inductor coil 13 serves as a second input terminal of the cryogenic memory cell 1, the second input terminal X of the inductor coil 13 is configured to input a second write current $I_{write\_X}$ and a second read current $I_{read\_X}$, the ground terminal of the inductor coil 13 is in common-ground connection with the ground terminal of the spin moment transfer device 11 and the ground terminal of the nano-superconducting quantum interference device 12, and the ground terminal of the inductor coil 13, the ground terminal of the spin moment transfer device 11, and the ground terminal of the nano-superconducting quantum interference device 12 together serve as a ground terminal G of the cryogenic memory cell 1, wherein in a write operation, under the action of the second write current $I_{write\_X}$, the inductor coil 13 generates a pulsed magnetic field, which is coupled to the spin moment transfer device 11, and the spin moment transfer device 11 undergoes a magnetic moment reversal under the combined action of the first write current $I_{write\_X}$ and the pulsed magnetic field to achieve write storage of 0 and 1; and in a read operation, under the action of the second read current $I_{read\_X}$, the inductor coil 13 generates a magnetic flux coupled to the nano-superconducting quantum interference device 12, and the nano-superconducting quantum interference device 12 switches between a superconducting state and a normal state under the action of the first read current $I_{read\_Y}$, the magnetic flux coupled to the nano-superconducting quantum interference device 12 generated by the induction coil under the action of the second read current $I_{read\_X}$, and the magnetic flux for the magnetic moment of the spin moment transfer device 11 coupled to the nano-superconducting quantum interference device 12, to achieve read-out of 0 and 1.

As an example, referring to FIG. 2, the spin moment transfer device 11 includes a fixed magnet-containing layer 111, a metal layer 112 and a free magnetic layer 113 stacked together. The fixed magnet-containing layer 111 is a permanent iron magnetic layer, and the fixed magnet-containing layer 111 is configured to convert the write current $I_{write}$ into a spin polarization current, and the free magnetic layer 113 is a temporary iron magnetic layer, and the free magnetic layer 113 changes its magnetic polarization direction when the spin polarization current flows therethrough, to achieve write storage of 0 and 1. Specifically, the fixed magnet-containing layer 111, the metal layer 112 and the free magnetic layer 113 may be stacked successively from bottom to top. The specific structures of the fixed magnet-containing layer 111, the metal layer 112 and the free magnetic layer 113 are known to those skilled in the art.

Specifically, a current pulse of the first write current $I_{write\_Y}$ is applied at the input terminal WY of the spin moment transfer device 11, and at the same time the second write current $I_{write\_X}$ is applied at the input terminal X of the inductor coil 13, to generate, by the inductor coil 13, a pulsed magnetic field, the magnitude of which is $H=LM_W \times I_{write\_X}$ when the pulsed magnetic field is coupled to the free magnetic layer 113 of the spin moment transfer device 11, wherein LMW is a coupling coefficient for the coupling between the inductor coil 13 and the free magnetic layer 113, and under the combined action of the second write current $I_{write\_X}$ and the first write current $I_{write\_Y}$, the magnetic moment of the free magnetic layer 113 may be shifted between +m and −m to achieve write storage of 0 and 1. The first read current $I_{read\_Y}$ is applied to the nano-superconducting quantum interference device 12 at the input/output terminal RY of the nano-superconducting quantum interference device 12. When the first read current $I_{read\_Y}$ is close to (e.g., equal or approximately equal to) a critical current of the nano-superconducting quantum interference device 12, the nano-superconducting quantum interference device 12 periodically switches between the superconducting state and the normal state under the drive of a flux change, which manifests as a periodic modulation conversion of the readout signal $V_{out}$, wherein one period of the periodic modulation conversion of the readout signal is denoted as one flux quantum $\varphi_0$; in operation, a magnetic flux generated by the magnetic moment m of the free magnetic layer 113 coupled to the nano-superconducting quantum interference device 12 is $\varphi_1 = \alpha m$, wherein a is a coupling coefficient of the coupling between the magnetic moment of the spin moment transfer device 11 and the nano-superconducting quantum interference device 12, and at the same time, a magnetic flux that is generated by the magnetic moment m' of the fixed magnet-containing layer 111 and coupled to the nano-superconducting quantum interference device 12 is $\varphi_2 = \alpha m'$; and a magnetic flux that is generated by the second read current $I_{read\_X}$ through the inductor coil 13 and coupled to the nano-superconducting quantum interference device 12 is $\varphi_3 = LM_R \times I_{read\_X}$, where $LM_R$ is a coupling coefficient for the coupling between the inductor coil 13 and the nano-superconducting quantum interference device 12. When the conditions are satisfied: $\varphi = LM_R \times I_{read\_X} + \alpha m' = \varphi_0/2$, and $\alpha m > \delta\varphi$, the free magnetic layer 113 switches between +m and −m, which drives the nano-superconducting quantum interference device 12 to also switch between the superconducting state and the normal state, and the readout signal $V_{out}$ is generated at the input/output terminal RY of the nano-superconducting quantum interference device 12 to achieve read-out of 0 and 1, where $\varphi$ is a flux variable of the conversion between the superconducting state and the normal state of the nano-superconducting quantum interference device 12 when the above-mentioned conditions are met; and $\delta\varphi$ is a width of the conversion between the superconducting state and the normal state of the nano-superconducting quantum interference device 12 when the above-mentioned conditions are met.

Specifically, the cryogenic memory cell 1 described in this embodiment may be simplified as a memory cell with four terminals (that is, the first input terminal WY, the second input terminal X, the input/output terminal RY, and the ground terminal G). Based on a read/write pulse sequence, current pulses input at the first input terminal WY and the second input terminal X can achieve write storage of 0 and 1, and current pulses input at the second input terminal X and the input/output terminal RY at the same time can achieve read-out of 0 and 1 at the input/output terminal RY.

The spin moment transfer device 11 needs a drive current of around 0.1 mA to 0.2 mA. For a semiconductor magnetic memory (e.g. MRAM) in the prior art, to maintain a semiconductor device at a standard voltage of around 1V and effectively read out a resistive-state resistance value, a magnetic tunnel junction device needs to be further connected in series with the spin moment transfer device 11 so that the resistance of the memory cell cam ne around 10K ohm. In the cryogenic memory cell in the present application, as the spin moment transfer device 11 is in common-ground connection with the nano-superconducting quantum interference device 12 and the induction coil 13, and the nano-superconducting quantum interference device 12 reads out the required readout signal, there is no special requirement on the resistance value of the spin moment transfer device 11, and thus the resistance of the spin moment transfer device 11 can be greatly reduced (the resistance of the spin moment transfer device 11 only needs to be 1 ohm to 10 ohm), thereby reducing the power consumption for write storage of the cryogenic memory cell 1 and increasing a write speed of the cryogenic memory cell 1; as the spin moment transfer device 11 is in common-ground connection with the nano-superconducting quantum interference device 12, and the nano-superconducting quantum interference device 12 reads out the required readout signal $V_{out}$, the readout signal Vout can be completely compatible with RSFQ circuit signals; furthermore, in terms of the cell size, the nano-superconducting quantum interference device 12 has a feature size of less than or equal to 100 nm (preferably, in this embodiment, the nano-superconducting quantum interference device 12 has a feature size of 100 nm or less), and the feature size of the nano-superconducting quantum interference device 12 used here may be 100 nm or less, such that the entire cryogenic memory cell 1 is around 100 nm, and using a plurality of cryogenic memory cells 1 in combination can achieve high-density integration, thereby achieving high-capacity storage.

Embodiment 3

Figure 4:
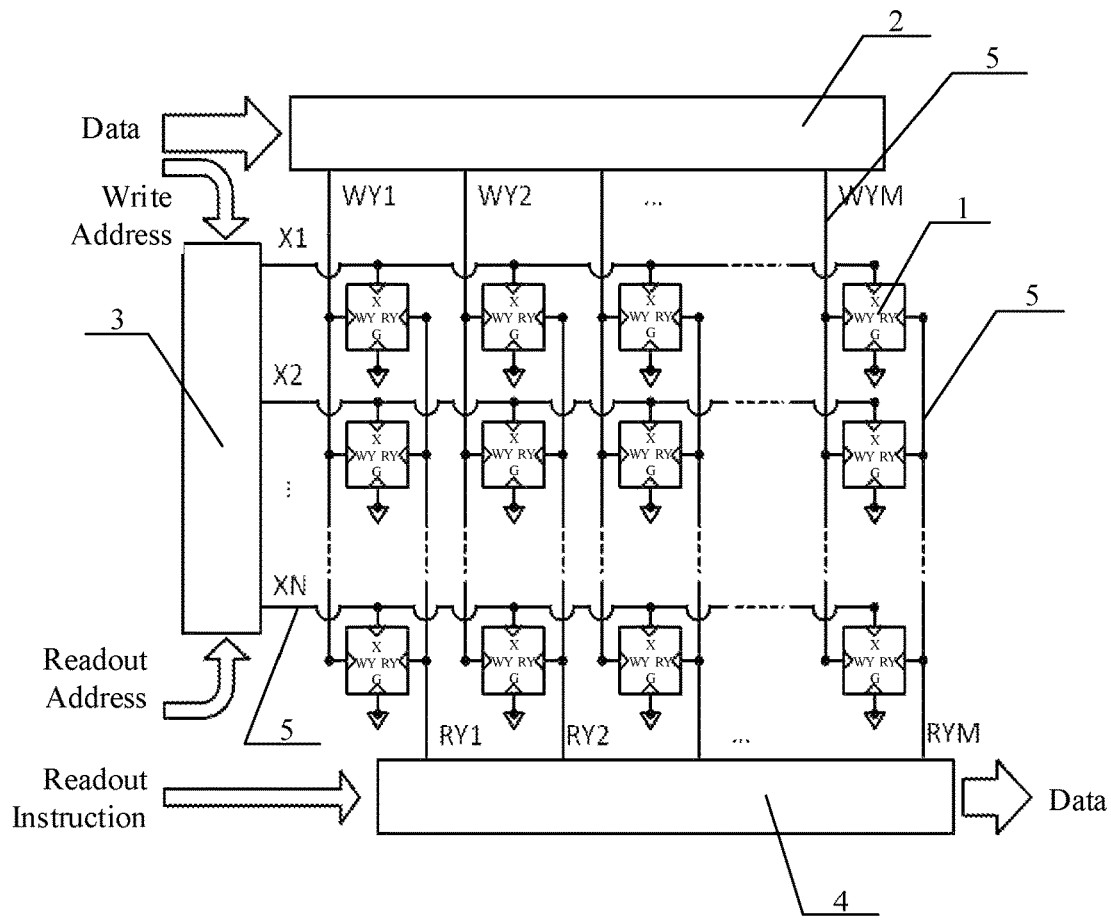
FIG. 4 shows a schematic structural diagram of a memory device provided in Embodiment 3 of the present disclosure.

Referring to FIG. 4 in conjunction with FIG. 3, the present disclosure also provides a memory device. The memory device includes: a plurality of cryogenic memory cells 1 as described in Embodiment 2, the plurality of the cryogenic memory cells 1 is arranged at intervals in multiple rows and multiple columns; a data writing RSFQ control circuit 2, the data writing RSFQ control circuit 2 successively connecting in series first input terminals WY of the cryogenic memory cells 1 located in a same column; an address compiling RSFQ control circuit 3, the address compiling RSFQ control circuit 3 successively connecting in series second input terminals X of the cryogenic memory cells 1 located in a same row; and a data readout RSFQ control circuit 4, the data readout RSFQ control circuit 4 successively connecting in series input/output terminals RY of the cryogenic memory cells 1 located in a same column, wherein ground terminals G of the cryogenic memory cells 1 are all grounded. The memory device of the present disclosure includes a plurality of cryogenic memory cells 1 described in Embodiment 2, and has the advantages of high integration density and the possibility of large-capacity storage.

Specifically, for the specific structure of the cryogenic memory cells 1, please refer to Embodiment 2.

As an example, the plurality of the cryogenic memory cells 1 may be arranged at intervals in N rows and M columns; the data writing RSFQ control circuit 2 successively connects in series first input terminals WY of the cryogenic memory cells 1 located in a same column, respectively, via M connecting lines 5; the address compiling RSFQ control circuit 3 successively connects in series second input terminals X of the cryogenic memory cells 1 located in a same row, respectively, via N connecting lines 5; and the data readout RSFQ control circuit 4 successively connects in series input/output terminals RY of the cryogenic memory cells 1 located in a same column, respectively, via M connecting lines 5, where M and N are both integers greater than 1. Specifically, the first input terminals WY of the cryogenic memory cells 1 located in the same column are connected to the data writing RSFQ control circuit 2 via a same connecting line 5, and the first input terminals WY of the cryogenic memory cells 1 located in different columns are connected to the data writing RSFQ control circuit 2 via different connecting lines 5; the second input terminals X of the cryogenic memory cells 1 located in the same row are connected to the address compiling RSFQ control circuit via a same connecting line 5, and the second input terminals X of the cryogenic memory cells 1 located in different rows are connected to the data address compiling RSFQ control circuit 3 via different connecting lines 5; and the input/output terminal RY of the cryogenic memory cells 1 located in the same column are connected to the data readout RSFQ control circuit 2 via a same connecting line 5, and the input/output terminals RY of the cryogenic memory cells 1 located in different columns are connected to the data readout RSFQ control circuit 2 via different connecting lines 5.

It is to be noted that, in FIG. 4, "data" input to the data writing RSFQ control circuit 2 is the first write current $I_{write\_Y}$; a "readout instruction" input to the data readout RSFQ control circuit 4 is the first read current $I_{read\_Y}$, and "data" output by the data readout circuit RSFQ control circuit 4 is the readout signal Vout; and a "write address" input to the address compiling RSFQ control circuit 3 is the second write current $I_{write\_X}$, and a "readout address" input to the address compiling RSFQ control circuit 3 is the second read current $I_{read\_X}$.

In summary, the present disclosure provides a cryogenic memory cell and a memory device; the cryogenic memory cell includes a spin moment transfer device including an input terminal and a ground terminal, wherein the input terminal of the spin moment transfer device is configured to receive an input write current, the spin moment transfer device converts the write current into a spin polarization current and changes a magnetic polarization direction under the action of the spin polarization current to achieve write storage of 0 and 1; the cryogenic memory cell also includes a nano-superconducting quantum interference device including an input/output terminal and a ground terminal, wherein the input/output terminal of the nano-superconducting quantum interference device is configured to receive an input read current and output a readout signal, the ground terminal of the nano-superconducting quantum interference device is in common-ground connection with the ground terminal of the spin moment transfer device, the nano-superconducting quantum interference device undergoes a magnetic flux change under the action of a change in the magnetic polarization direction of the spin moment transfer device, thereby switching between a superconducting state and a non-superconducting state under a read current bias, to achieve read-out of 0 and 1. In the cryogenic memory cell of the present disclosure, the nano-superconducting quantum interference device is used to read out the magnetic moment change, and there is no special requirement on the resistance value of the spin moment transfer device, and thus the resistance of the spin moment transfer device can be greatly reduced, thereby reducing the power consumption for write storage of the cryogenic memory cell and increasing a write speed of the cryogenic memory cell; furthermore, the nano-superconducting quantum interference device is used to read out the readout signal, which can be completely compatible with RSFQ circuit signals; the cryogenic memory cell of the present disclosure has a small size and can achieve high-density integration, thereby achieving high-capacity storage; and the memory device of the present disclosure includes a plurality of cryogenic memory cells with a high integration density, and can achieve large-capacity storage.

The above embodiments are merely illustrative of the principles of the present disclosure and effects thereof, and are not intended to limit the present disclosure. Any person skilled in the art can modify or change the above embodiments without departing from the spirit and scope of the present disclosure. Therefore, all equivalent modifications or changes made by those with general knowledge in the technical field without departing from the spirit and technical ideas disclosed in the present disclosure are still covered by the claims of the present disclosure.

The invention claimed is:

1. A cryogenic memory cell, comprising:
   a spin moment transfer device comprising an input terminal and a ground terminal, wherein the input terminal of the spin moment transfer device is configured to receive an input write current, the spin moment transfer device converts the write current into a spin polarization current and changes its magnetic polarization direction under the action of the spin polarization current to achieve write storage of 0 and 1; and
   a nano-superconducting quantum interference device comprising an input/output terminal and a ground terminal, wherein the input/output terminal of the nano-superconducting quantum interference device is configured to receive an input read current and output a readout signal, the ground terminal of the nano-superconducting quantum interference device is in common-ground connection with the ground terminal of the spin moment transfer device, the nano-superconducting quantum interference device undergoes a magnetic flux change under the action of a change in the magnetic polarization direction of the spin moment transfer device, thereby switching between a superconducting state and a non-superconducting state under a read current bias, to achieve read-out of 0 and 1.

2. The cryogenic memory cell according to claim 1, wherein the spin moment transfer device comprises a fixed magnet-containing layer, a metal layer, and a free magnetic layer stacked together, the fixed magnet-containing layer is configured to convert the write current into a spin polarization current, and the free magnetic layer changes the magnetic polarization direction when the spin polarization current flows therethrough, to achieve write storage of 0 and 1.

3. The cryogenic memory cell according to claim 1, wherein the spin moment transfer device has a feature size of less than or equal to 100 nm, and the spin moment transfer device has a resistance ranging from 1 ohm to 10 ohm, and the nano-superconducting quantum interference device has a feature size of less than or equal to 100 nm.

4. A cryogenic memory cell, comprising:
   a spin moment transfer device comprising an input terminal and a ground terminal, wherein the input terminal of the spin moment transfer device serves as a first input terminal of the cryogenic memory cell to receive an input first write current;
   a nano-superconducting quantum interference device comprising an input/output terminal and a ground terminal, the input/output terminal of the nano-superconducting quantum interference device serves as an input/output terminal of the cryogenic memory cell to receive an input first read current and output a readout signal; and
   an inductor coil comprising an input terminal and a ground terminal, wherein the input terminal of the inductor coil serves as a second input terminal of the cryogenic memory cell to receive an input second write current and second read current, the ground terminal of the inductor coil is in common-ground connection with the ground terminal of the spin moment transfer device and the ground terminal of the nano-superconducting quantum interference device, and the ground terminal of the inductor coil, the ground terminal of the spin moment transfer device, and the ground terminal of the nano-superconducting quantum interference device together serve as a ground terminal of the cryogenic memory cell, wherein
   in a write operation, under the action of the second write current, the inductor coil generates a pulsed magnetic field, which is coupled to the spin moment transfer device, and the spin moment transfer device undergoes a magnetic moment reversal under the combined action of the first write current and the pulsed magnetic field to achieve write storage of 0 and 1; and
   in a read operation, under the action of the second read current, the inductor coil generates a magnetic flux coupled to the nano-superconducting quantum interference device, and the nano-wire superconducting quantum interference device switches between a superconducting state and a normal state under the action of the first read current, the magnetic flux coupled to the nano-superconducting quantum interference device generated by the induction coil under the action of the second read current, and a magnetic flux for a magnetic moment of the spin moment transfer device coupled to the nano-superconducting quantum interference device, to achieve read-out of 0 and 1.

5. The cryogenic memory cell according to claim 4, wherein the spin moment transfer device comprises a fixed magnet-containing layer, a metal layer and a free magnetic layer stacked together, the fixed magnet-containing layer is configured to convert the first write current into a spin polarization current, and the free magnetic layer changes its magnetic polarization direction when the spin polarization current flows therethrough to achieve write storage of 0 and 1.

6. The cryogenic memory cell according to claim 4, wherein a magnetic flux that is generated by a magnetic moment of the free magnetic layer and coupled to the nano-superconducting quantum interference device is $\varphi 1=\alpha m$, and a magnetic flux that is generated by a magnetic moment of the fixed magnet-containing layer and coupled to the nano-superconducting quantum interference device is $\varphi 2=\alpha m'$, where m is the magnetic moment of the free magnetic layer, m' is the magnetic moment of the fixed magnet-containing layer, and $\alpha$ is a coupling coefficient for the coupling between the magnetic moment of the spin moment transfer device and the nano-superconducting quantum interference device, and a magnetic flux that is generated by the second read current through the inductor coil and coupled to the nano-superconducting quantum interference device is $\varphi 3 = LMR \times Iread\_X$, wherein LMR is a coupling coefficient for the coupling between the inductor coil and the nano-superconducting quantum interference device, and $Iread\_X$ is the second read current; when the first read current is close to a critical current of the nano-superconducting quantum interference device, the readout signal periodically changes, one period of the periodic change of the readout signal is denoted as a flux quantum $\varphi 0$; and when the conditions are satisfied: $\varphi = LMR \times Iread\_X + \alpha m' = \varphi 0/2$, and $\alpha m > \delta \varphi$, the nano-superconducting quantum interference device switches between the superconducting state and the normal state and achieves read-out of 0 and 1, where $\varphi$ is a flux variable of the conversion between the superconducting state and the normal state of the nano-superconducting quantum interference device when the following conditions are met, and $\delta \varphi$ is a width of the conversion between the superconducting state and the normal state of the nano-superconducting quantum interference device when the following conditions are met.

7. The cryogenic memory cell according to claim 4, wherein the spin moment transfer device has a resistance ranging from 1 ohm to 10 ohm, and the nano-superconducting quantum interference device has a feature size of less than or equal to 100 nm.

8. A memory device, comprising:
a plurality of cryogenic memory cells of claim 1, wherein the plurality of cryogenic memory cells is arranged at intervals in multiple rows and multiple columns;
a data writing RSFQ control circuit, which successively connects first input terminals of the cryogenic memory cells located in a same column in series;
an address compiling RSFQ control circuit, which successively connects second input terminals of the cryogenic memory cells located in a same row in series; and
a data readout RSFQ control circuit, which successively connects input/output terminals of the cryogenic memory cells located in a same column in series, wherein ground terminals of the cryogenic memory cells are all grounded.

9. The memory device according to claim 8, wherein the plurality of the cryogenic memory cells are arranged at intervals in N rows and M columns; the data writing RSFQ control circuit successively connects first input terminals of the cryogenic memory cells located in a same column of the M columns in series, respectively, via M connecting lines; the address compiling RSFQ control circuit successively connects second input terminals of the cryogenic memory cells located in a same row of the N rows in series, respectively, via N connecting lines; and the data readout RSFQ control circuit successively connects input/output terminals of the cryogenic memory cells located in a same column of the columns in series, respectively, via M connecting lines, where M and N are both integers greater than 1.

* * * * *